(12) United States Patent
Réblewski et al.

(10) Patent No.: US 8,010,826 B2
(45) Date of Patent: *Aug. 30, 2011

(54) RECONFIGURABLE CIRCUIT WITH REDUNDANT RECONFIGURABLE CLUSTER(S)

(75) Inventors: Frédéric Réblewski, Paris (FR); Olivier V. LePape, Paris (FR)

(73) Assignee: Meta Systems, Meudon la Forêt (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/616,682

(22) Filed: Nov. 11, 2009

(65) Prior Publication Data

US 2010/0095147 A1   Apr. 15, 2010

Related U.S. Application Data (63) Continuation-in-part of application No. 12/331,097, filed on Dec. 9, 2008, now abandoned, which is a continuation of application No. 11/225,750, filed on Sep. 13, 2005, now Pat. No. 7,478,261.

(51) Int. Cl.
    *G06F 11/00* (2006.01)
(52) U.S. Cl. ............... 714/3; 714/30; 714/733
(58) Field of Classification Search ............ None
    See application file for complete search history.

(56) References Cited

U.S. PATENT DOCUMENTS

| | | |
|---|---|---|
| 4,020,469 A | 4/1977 | Manning |
| 4,642,487 A | 2/1987 | Carter |
| 4,700,187 A | 10/1987 | Furtek |
| 4,870,302 A | 9/1989 | Freeman |
| 4,918,440 A | 4/1990 | Furtek |
| 5,208,491 A | 5/1993 | Ebeling et al. |
| RE34,363 E | 8/1993 | Freeman |
| 5,255,203 A | 10/1993 | Agrawal et al. |
| 5,260,610 A | 11/1993 | Pedersen et al. |
| 5,396,126 A | 3/1995 | Britton et al. |
| 5,430,734 A | 7/1995 | Gilson |
| 5,455,525 A | 10/1995 | Ho et al. |
| 5,457,410 A | 10/1995 | Ting |
| 5,498,975 A | 3/1996 | Cliff et al. |
| 5,519,629 A | 5/1996 | Snider |
| 5,574,388 A | 11/1996 | Barbier et al. |

(Continued)

FOREIGN PATENT DOCUMENTS

FR   2660510   10/1991

OTHER PUBLICATIONS

Demjanenko, M. et al., "Dynamic Techniques for Yield Enhancement of Field Programmable Logic Arrays," IEEE International Test Conference, Sep. 1988, pp. 485-491.

(Continued)

*Primary Examiner* — Marc Duncan
(74) *Attorney, Agent, or Firm* — Dickstein Shapiro LLP (57) ABSTRACT

Reconfigurable circuits, methods, and systems with reconfigurable interconnect devices, clusters of reconfigurable logic devices, and a programming interface configured to receive configuration data to configure a first combination of the reconfigurable interconnect and logic devices to implement a circuit, and to remap a portion of the received configuration data, corresponding to a defective cluster, from the defective cluster to another non-defective cluster of the plurality of clusters to configure a second combination of the reconfigurable interconnect and logic devices to implement the circuit.

26 Claims, 6 Drawing Sheets

U.S. PATENT DOCUMENTS

| | | | |
|---|---|---|---|
| 5,594,363 | A | 1/1997 | Freeman et al. |
| 5,640,327 | A | 6/1997 | Ting |
| 5,648,911 | A | 7/1997 | Grodstein et al. |
| 5,742,181 | A | 4/1998 | Rush |
| 5,777,887 | A * | 7/1998 | Marple et al. ............... 716/4 |
| 5,796,268 | A | 8/1998 | Kaplinsky |
| 5,825,203 | A | 10/1998 | Kusunoki et al. |
| 5,939,930 | A | 8/1999 | Young |
| 5,991,517 | A * | 11/1999 | Harari et al. ............... 714/3 |
| 6,034,536 | A | 3/2000 | McClintock et al. |
| 6,088,526 | A | 7/2000 | Ting et al. |
| 6,137,308 | A | 10/2000 | Nayak |
| 6,148,390 | A | 11/2000 | MacArthur et al. |
| 6,166,559 | A * | 12/2000 | McClintock et al. ........ 326/10 |
| 6,167,558 | A | 12/2000 | Trimberger |
| 6,201,404 | B1 | 3/2001 | Reddy et al. |
| 6,204,688 | B1 | 3/2001 | Cliff et al. |
| 6,215,326 | B1 | 4/2001 | Jefferson et al. |
| 6,218,859 | B1 | 4/2001 | Pedersen et al. |
| 6,259,272 | B1 | 7/2001 | Cliff et al. |
| 6,289,494 | B1 | 9/2001 | Sample |
| 6,294,928 | B1 | 9/2001 | Lytle et al. |
| 6,344,755 | B1 * | 2/2002 | Reddy et al. ............... 326/10 |
| 6,347,378 | B1 * | 2/2002 | MacArthur et al. .......... 713/310 |
| 6,976,198 | B1 * | 12/2005 | Vaida ............... 714/725 |
| 7,205,785 | B1 * | 4/2007 | Carlson ............... 326/8 |
| 7,251,804 | B1 * | 7/2007 | Trimberger ............... 716/16 |
| 7,277,346 | B1 * | 10/2007 | Rahim et al. ............... 365/225.7 |
| 2002/0031025 | A1 * | 3/2002 | Shimano et al. ............... 365/201 |
| 2002/0113619 | A1 | 8/2002 | Wong |

OTHER PUBLICATIONS

Wey, C.L. et al., "Design of Repairable and Fully Testable Folded PLAs," IEEE Conference on Computer Design: VLSI in Computers and Processors, Sep. 1990, pp. 112-116.

Xilinx, Inc. "Virtex 2.5 V Field programmable Gate Arrays," Product Specification DS003-2 (v2.6), Jul. 19, 2001, 20 pages.

Xilinx, Inc. "XC4000E and XC4000X Series Field Programmable Gate Arrays," Product Specification (v1.6), May 14, 1999, 70 pages.

Xilinx, Inc. "XC3000 Series Field Programmable Gate Arrays (XC2000A/L, XC300A/L)" Product Specification v3.1, Nov. 9, 1998, 78 pages.

Amerson, R. et al. "Plasma: An FPGA for Million Gate Systems" Proceedings of the 1996 ACM Fourth International Symposium on Field-Programmable Gate Arrays, Feb. 1996, 7 pages.

Hill, D. et al. "Preliminary Description of Tabula Rasa, an Electrically Reconfigurable Hardware Engine," IEEE International Conference on Computer Design: VLSI in Computers and Processors, Sep. 1990, pp. 391-395.

Rose, J. et al. "Architecture of Field-Programmable Gate Arrays: The Effect of Logic Block Functionality on Area Efficiency" IEEE Journal of Solid-State Circuits, Oct. 1990, pp. 1217-1225, vol. 25, No. 5.

Chow, P. et al. "The Design of an SRAM-Based Field-Programmable Gate Array—Part I: Architecture," IEEE Transactions on Very Large Scale Integration (VLSI) Systems, Jun. 1999, pp. 191-197, vol. 7, No. 2.

Chow, P. et al. "The Design of an SRAM-Based Field-Programmable Gate Array—Part II: Circuit Design and Layout," IEEE Transactions on Very Large Scale Integration (VLSI) Systems, Sep. 1999, pp. 321-330, vol. 7, No. 3.

Hanchek, F. et al., "Node-Covering Based Defect and Fault Tolerance Methods for Increased Yield in FPGAs*," 9th International Conference on VLSI Design, Jan. 1996, pp. 225-229.

Doumar, A. et al., "Design of an Automatic Testing for FPGAs," Proceedings of the 1999 IEEE European Test Workshop, May 1999, pp. 152-157.

International Search Report and Written Opinion, issued in International Patent Application No. PCT/EP2006/008820, mailed Dec. 14, 2006, 10 pages.

* cited by examiner

RECONFIGURABLE CIRCUIT WITH REDUNDANT RECONFIGURABLE CLUSTER(S)

RELATED APPLICATIONS

This application is a continuation-in-part of application Ser. No. 12/331,097, filed Dec. 9, 2008, which is a continuation of application Ser. No. 11/225,750 filed Sep. 13, 2005, now issued as U.S. Pat. No. 7,478,261, all of which are hereby incorporated herein by reference in their entirety.

TECHNICAL FIELD

The present invention relates to the field of reconfigurable circuits; in particular, to a reconfigurable circuit with redundant reconfigurable cluster(s), and its applications.

BACKGROUND

Reconfigurable circuits are circuit devices that may be reconfigured through programming to realize a variety of different functions, so long as the complexities of the desired functions are not too high. An example of the reconfigurable circuits is the Field Programmable Gate Array (FPGA) circuit. Typically, 20 to 50 transistors of a reconfigurable circuit are required to implement each transistor of a target function. As a result, reconfigurable circuits tend to be the largest circuits for each generation of integrated circuit technology. In turn, because of the inherent large size, manufacturing yield and pre-mature partial operational failure have been persistent problems for the reconfigurable circuit manufacturers and users.

Nonetheless, reconfigurable circuits are popular because they introduce low Non Recurring Expenses (NRE) when compared to Application Specific Integrated Circuit (ASIC). Further, reconfigurable circuits enable ASIC, up to a certain degree of complexity, to be emulated to ensure correctness, before the ASIC are rendered into actual silicon. A process that significantly reduces the cost of ASIC development.

Currently, one technique for addressing the various yield problems is to bypass defective elements through laser trimming during the fabrication process. After the circuits are tested, a laser is used to cut some connections in such a way that defective elements are bypassed. Pre-mature partial failures are mainly addressed through a burn-in process, which is a technique for artificially aging the component to eliminate those that experience early failures. Both of these techniques incur a significant cost during the fabrication process and give no guarantee regarding the possibility of failures at any time during the lifetime of the component.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The description may use the phrases "in an embodiment," or "in embodiments," which may each refer to one or more of the same or different embodiments. Furthermore, the terms "comprising," "including," "having," and the like, as used with respect to embodiments, are synonymous.

Figure 1:
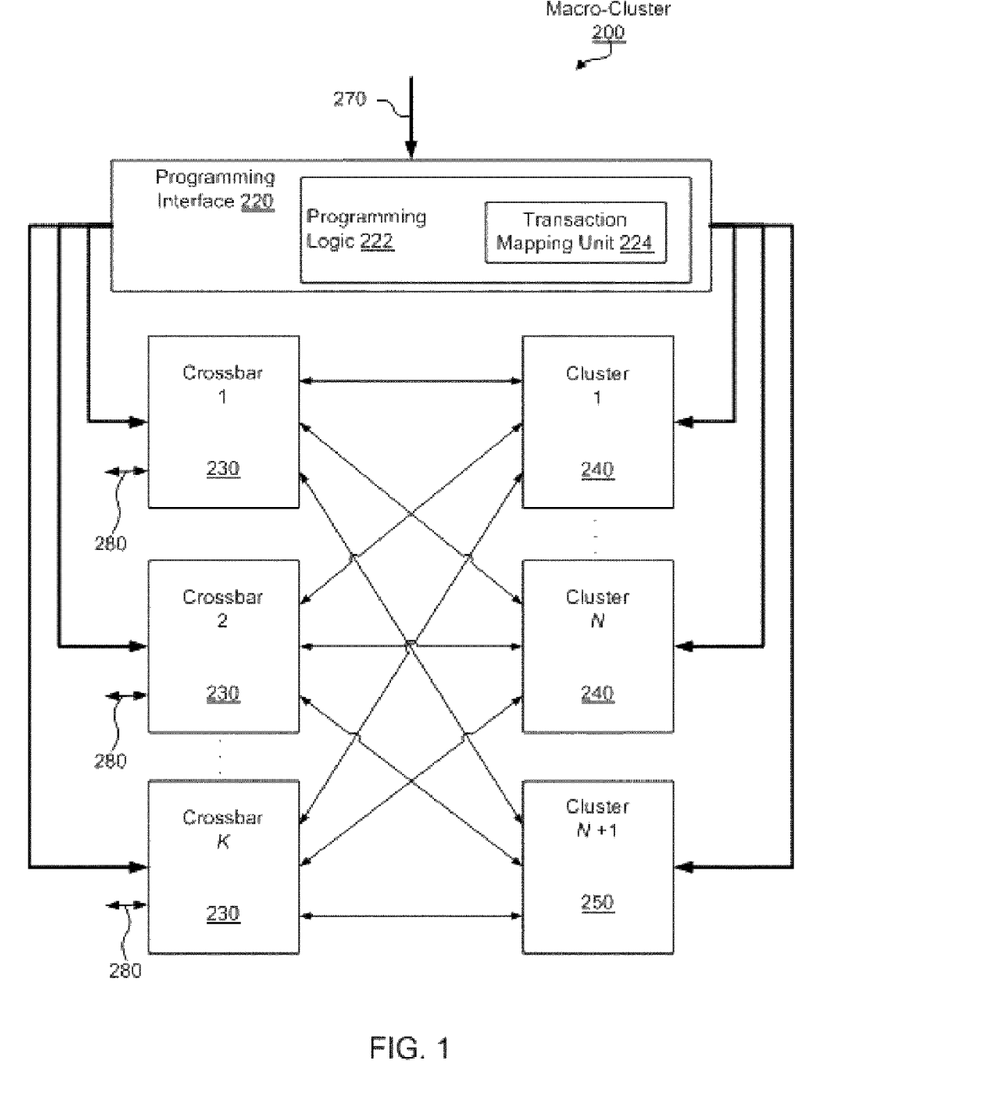
FIG. 1 illustrates a block diagram of a portion of a reconfigurable circuit, employing one or more redundant clusters, in accordance with various embodiments of the present invention.

Referring now to FIG. 1, wherein a block diagram of a portion of a reconfigurable circuit having one or more redundant reconfigurable clusters, in accordance with embodiments of the invention, is shown. For the embodiments, the portion illustrated is referred to as a macro reconfigurable cluster 200 of the reconfigurable circuit (hereinafter, simply macro-cluster). The reconfigurable circuit may have one or more of the illustrated macro-cluster 200, coupled to each other, with each macro-cluster 200 having a number of reconfigurable clusters 240 and 250 (hereinafter, simply clusters). Each cluster may have a number of resources. Examples of such resources include but are not limited to reconfigurable logic, memory, multiplier, and so forth. However, in alternate embodiments, the present invention may be practiced with or without the various clusters being organized into macro-clusters.

Additionally, for the embodiments, macro-cluster 200 includes a number of reconfigurable interconnect devices 230 and programming interface 220, coupled to each other and clusters 240 and 250 as shown. An example of a reconfigurable interconnect device is a crossbar. As will be described in more detail below, programming interface 220 is endowed with appropriate logic suitable for the constitutions of clusters 240 and 250 of the particular embodiments, to enable a subset of clusters 240 and 250, e.g. clusters 240, to be externalized for application usage, and the remaining cluster or clusters, e.g. cluster 250, to operate as a redundant cluster or clusters, transparently replacing a defective one or defective ones of the externalized clusters. As will be described in more detail below, the externalized clusters may be logical, as opposed to physical. The externalized clusters, whether logical or physical, may be referred to as primary clusters.

For the purpose of this invention, the term "transparency" and its related variants refer to the fact that at a minimum, the corresponding substitution of one of the one or more redundant clusters, e.g. cluster 250, for a defective one of the remaining clusters, e.g. cluster 240, is inconsequential to the configuration data stream for configuring the replacing cluster as well as the remaining clusters 240 to perform a set of targeted function(s). In other words, the configuration data stream does not have to be modified, even though one of the targeted clusters may be defective.

For the purpose of this invention, a defect in a reconfigurable interconnect device 230 that translates into the incapacity/inability to connect with a reconfigurable cluster 240 or 250 may be considered to be a defect of said reconfigurable cluster 240 or 250.

Continuing to refer to FIG. 1, in various embodiments, macro-cluster 200 has n+1 clusters 240 and 250 that are homogenous, i.e., clusters 240 and 250 are identical clusters (hereinafter, homogeneous embodiments). In various ones of these homogeneous embodiments, programming interface 220 is adapted with appropriate logic, to be described more fully below, such that, n of the n+1 clusters 240 may be externalized for application usage, with the single remaining cluster 250 operating as a redundant cluster. That is, for these homogeneous embodiments, redundant cluster 250 may be employed to transparently replace any defective one of the n externalized clusters 240.

Before proceeding with further description, it should be noted that while for ease of understanding, the homogenous embodiments are described with the subset of the "top" n clusters 240 illustrated in FIG. 1 as being externalized for application usage, and the "lowest" cluster 250 as the redundant cluster, the arrangement is transparent to the application, and known only to programming interface 220. Moreover, in various alternate embodiments, the invention may be practiced with programming interface 220 operating with any n clusters of clusters 240 and 250 as externalized for application usage, and the remaining one as the redundant cluster.

In various ones of the homogeneous embodiments, programming interface 220 is adapted with appropriate logic, also to be described more fully below, such that, m of the n+1 clusters 240 and 250, m and n being both greater than 1, but m being less than n, are externalized for application usage, and the remaining n+1−m clusters 240 and 250 are operated as the redundant clusters. That is, for these homogeneous embodiments, any one of the n+1−m redundant clusters may be employed to replace any defective one of the m externalized clusters, up to n+1−m externalized clusters.

In still other homogeneous embodiments, with programming interface 220 endowed with the appropriate logic, the m externalized clusters may be logical, that are mapped to any m of the n+1 physical reconfigurable clusters. Thus, for these homogeneous embodiments, any one of the n+1 clusters, up to n+1−m clusters, may be employed to replace up to n+1−m defective clusters.

Still referring to FIG. 1, in various embodiments, the n+1 clusters 240 and 250 are heterogeneous, that is, at least two of clusters 240 and 250 are dissimilar from each others (hereinafter, heterogeneous embodiments). For these heterogeneous embodiments, in addition to programming interface 220 being endowed with the appropriate logic, at least one of the clusters 240 and 250 is endowed with the union of the resource of one each of the different clusters, e.g. cluster 250 (hereinafter, "super" cluster). The other dissimilar clusters, e.g. clusters 240, are externalized for application usage. Accordingly, "super" cluster 250 may be employed to replace a defective one of the various externalized dissimilar clusters.

In various ones of these heterogeneous embodiments, externalized dissimilar clusters 240 include at least one reconfigurable cluster with a multiplier, and one reconfigurable cluster with memory. For these heterogeneous embodiments, "super" redundant reconfigurable cluster 250 includes both the multiplier and the memory.

In various ones of these heterogeneous embodiments, the various resource of a "super" reconfigurable cluster 250 are adapted to be in a default off state, and complementary resources are additionally provided to enable the resource to be selectively enabled (e.g. by programming interface 220). As a result, for these various heterogeneous embodiments, the programming view of the "super" reconfigurable cluster 250 is the same as the reconfigurable cluster 240 being replaced, whichever it is. However, in alternate embodiments, as will be described in more detail below, the "super" reconfigurable cluster 250 and the other heterogeneous reconfigurable clusters 240 may be allowed to have different programming views.

Continuing to refer to FIG. 1, in various embodiments, in addition to n+1 clusters 240 and 250, macro-cluster 200 has k reconfigurable interconnect devices 230, where k is an integer. For these embodiments, each cluster 240 or 250, homogeneous or heterogeneous, in addition to its reconfigurable resources (i.e. reconfigurable logic, memory, etc.), further includes a programming port coupled to programming interface 220, $\alpha*k$ input ports and $\beta*k$ output ports coupled to the k reconfigurable interconnect devices 230, where $\alpha$ and $\beta$ are also integers. Further, $\alpha$ of the input ports and $\beta$ of the output ports of a cluster 240 are coupled to each of the k reconfigurable interconnect devices 230. The reconfigurable resource is coupled to the programming port, the $\alpha*k$ input ports and the $\beta*k$ output ports. The reconfigurable resource of a cluster may be configured through the cluster's programming port to receive inputs from any of the cluster's $\alpha*k$ input ports and output onto any of the cluster's $\beta*k$ output ports.

In various ones of these embodiments, each interconnect device 230 includes a programming port coupled to programming interface 220, $\alpha*(n+1)$ output ports, $\beta.*(n+1)$ input ports, and reconfigurable interconnect elements. Further, $\alpha$ of the output ports and $\beta$ of the input ports of an interconnect device 230 are coupled to each of the clusters 240 and 250. The reconfigurable interconnect elements are coupled to the programming port; the $\alpha*(n+1)$ output ports, and the $\beta.*(n+1)$ input ports. The reconfigurable interconnect elements may be configured through the interconnect device's programming port to receive inputs from any of the interconnect device's α*k input ports and output onto any of the interconnect device's β*k output ports.

Still referring to FIG. 1, programming interface 220 includes programming port(s) 270 and programming logic 222. Programming port(s) 270 is (are) provided to facilitate receipt of configuration data from an external source to program reconfigurable clusters 240 and 250, and reconfigurable interconnect devices 230 to realize one or more targeted functions. Programming logic 222 is adapted to configure reconfigurable clusters 240 and 250, and interconnect devices 230 in accordance with the received configuration data. For the embodiments, programming logic 222 further includes configuration transaction mapping logic 224 adapted to remap configuration transactions targeted for at least a defective one of the primary reconfigurable clusters to target a replacement redundant cluster and to remap configuration transactions targeted for interconnect devices 230 so that connections to and from at least a defective one of the primary reconfigurable clusters are rerouted to a replacement redundant cluster.

In various embodiments, the transaction mapping logic 224 may be provided with the mapping information from an external resource, e.g. also through programming port 270. For these embodiments, the detection and identification of defective ones of the primary clusters may be performed by the external source also. Macro-cluster 200 may include additional testing access circuitry (not shown), e.g. scan cells, to enable testing circuitry external to macro-cluster 200 to perform the defect detection and identification. In various embodiments, macro-cluster 200 may include test circuitry dedicated to performing the defect detection and identification for the macro-cluster. In still other embodiments, each of clusters 240 and 250 may be provided with test circuitry dedicated to performing the defect detection and identification for the particular cluster.

In various embodiments, where dedicated test circuitry are provided to each macro-cluster 200, or each of clusters 240 and 250 to perform defect detection and identification, programming logic 222 may be further adapted to initiate on its own defect detection and identification testing, and configure transaction mapping logic 224 to operate accordingly, as long as the number of defective primary cluster or clusters is smaller than or equal to the number of redundant cluster or clusters available. In various embodiments, programming logic 222 is adapted to disable macro-cluster 200 and report its disabled condition, if it detected more defective primary clusters than available redundant clusters.

Still referring to FIG. 1, embodiments may include a set of N+1 clusters 240 and 250 and logic may be initially mapped to M of these clusters, where M<N+1. F of the M clusters may become (or may have already been) defective. Embodiments may be adapted to reconfigure macro-cluster 200 such that the logic originally mapped to the M clusters is remapped to some permutation of the N+1−F non-defective clusters (i.e., some combination of the N+1 clusters that are not defective). According to various embodiments, a non-defective cluster may have its logic remapped to another non-defective cluster. Logic from defective clusters may not necessarily be remapped to a redundant or unused cluster, although it may be remapped to a redundant or unused cluster. Embodiments described elsewhere within this Detailed Description, such as with reference to FIG. 5 and/or FIG. 6, involve one or more remapping techniques. It will be understood that various embodiments may employ remapping techniques not described with reference to FIG. 5 and/or FIG. 6, including for example a wholly or partially-arbitrary remapping scheme. Note that embodiments may be adapted to first determine that the number of defective clusters is less than or equal to the difference between the total number of clusters and the number of clusters used in an initial configuration (that is, whether $F \leq N+1-M$) before remapping the configuration logic. In other words, embodiments may determine whether there are at least as many unused clusters as there are defective clusters.

Because some set of M clusters may have logic mapped to them according to an initial configuration, there may be others of the N+1 clusters that have no logic initially mapped to them. These clusters may serve as "redundant" clusters under that initial configuration. But these "redundant clusters" may not necessarily be initially reserved as redundant clusters, or otherwise designated as being unused or "off limits" for an initial configuration. Thus, in embodiments, an initial mapping of logic to macro-cluster 200 may in embodiments be initially applied to any M of the N+1 clusters. And those of the N+1 clusters having no initial logic mapping may therefore serve as "redundant" clusters.

In other embodiments, there may be a group of redundant clusters that is designated as reserved, and thus is not used in an initial configuration. Using a reserved group of redundant clusters may result in less-complex remapping versus embodiments that have no reserved group of redundant clusters. In the same or other embodiments, a group of the N+1 clusters may be reserved as redundant clusters while at the same time unused ones of other non-reserved clusters according to an initial configuration may also serve as redundant clusters. Note that embodiments that utilize a reserved group of redundant clusters and embodiments that remap logic from a non-defective cluster to another non-defective cluster (as described above) are not mutually exclusive. Even in embodiments employing reserved redundant clusters, remapping techniques are not restricted to directly remapping logic from a defective cluster to one of the reserved redundant clusters.

Figure 2:
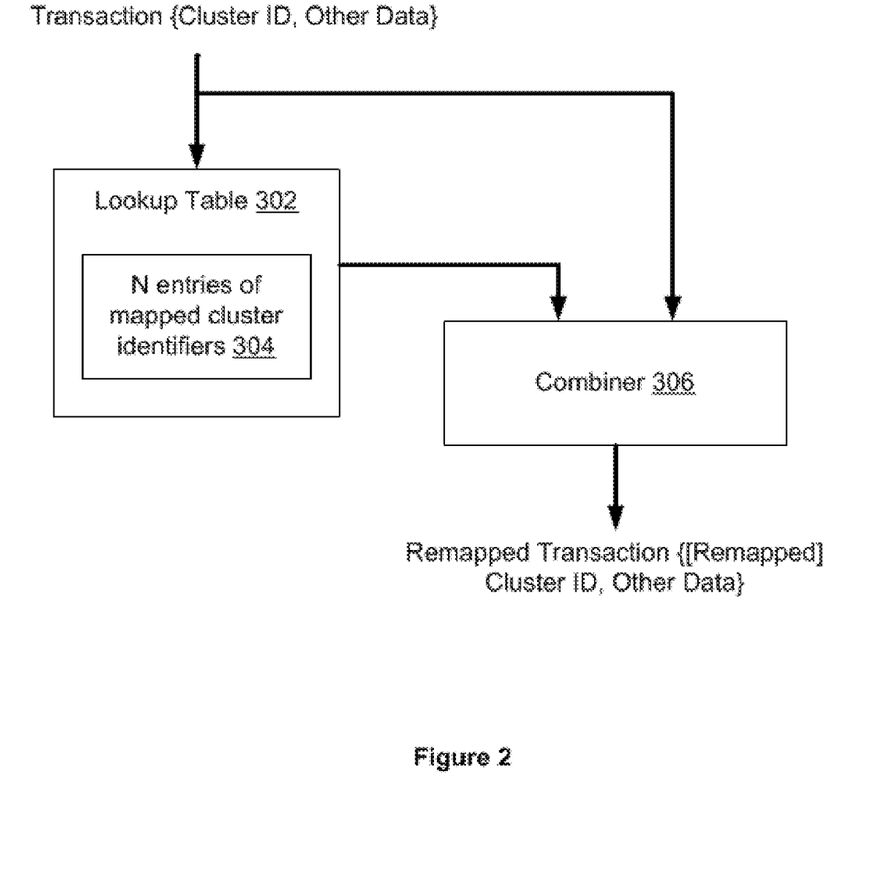
FIG. 2 illustrates a portion of the programming interface of FIG. 1 in further detail, in accordance with various embodiments.

Referring now to FIG. 2, wherein transaction mapping unit 224, in accordance with various embodiments, is illustrated in further detail. For the embodiments, transaction mapping unit 222 may include a lookup table 302 and combiner 306 coupled to each other as shown. Lookup table 302 includes n storage locations for storing mapping information 304 for n clusters. In various embodiments, mapping information 304 comprises n entries of remapped cluster identifications. For the physical embodiments, mapping information 304 maps each of n cluster identifiers of the n clusters to itself or the cluster identifier of the redundant cluster. For example, if cluster n+1 is the redundant cluster, and cluster $n_0$ is determined to be defective, the cluster identifier n+1 is stored in the storage location for storing mapping information 304 for cluster $n_0$ to map any transactions targeted for cluster $n_0$ to be retargeted for cluster n+1. For the logical embodiments, mapping information 304 maps each of the n logical cluster identifiers to a physical cluster, which may be a primary cluster or a redundant cluster.

In various embodiments, combiner 306 is employed to reconstitute the transactions, with the original identification for the targeted cluster of each transaction being replaced by an identifier of a redundant cluster read out of lookup table 302, if the targeted cluster is defective.

In various embodiments, programming logic 222 including transaction mapping logic 224 may be implemented in hardware or software, or a combination thereof, in whole or in part. For the embodiments, where at least a portion of programming logic 222 (e.g. all or portions of transaction mapping logic 224) is implemented in software, programming interface 220 may be provided with an appropriate non-volatile storage to store the implementing instructions, and a processor coupled to the non-volatile storage to execute the implementing instructions.

Note that the phrase "transactions targeted for a cluster" includes not only configuration transactions targeted for reconfigurable resources of a primary cluster, but also configuration transactions targeting to couple the various input and output ports of the interconnect devices 230 to the particular cluster. As illustrated, combiner 306 is employed to reconstitute the original transactions, based on the outputs of lookup table 302, and the corresponding other transaction data of the original transactions.

Figure 3:
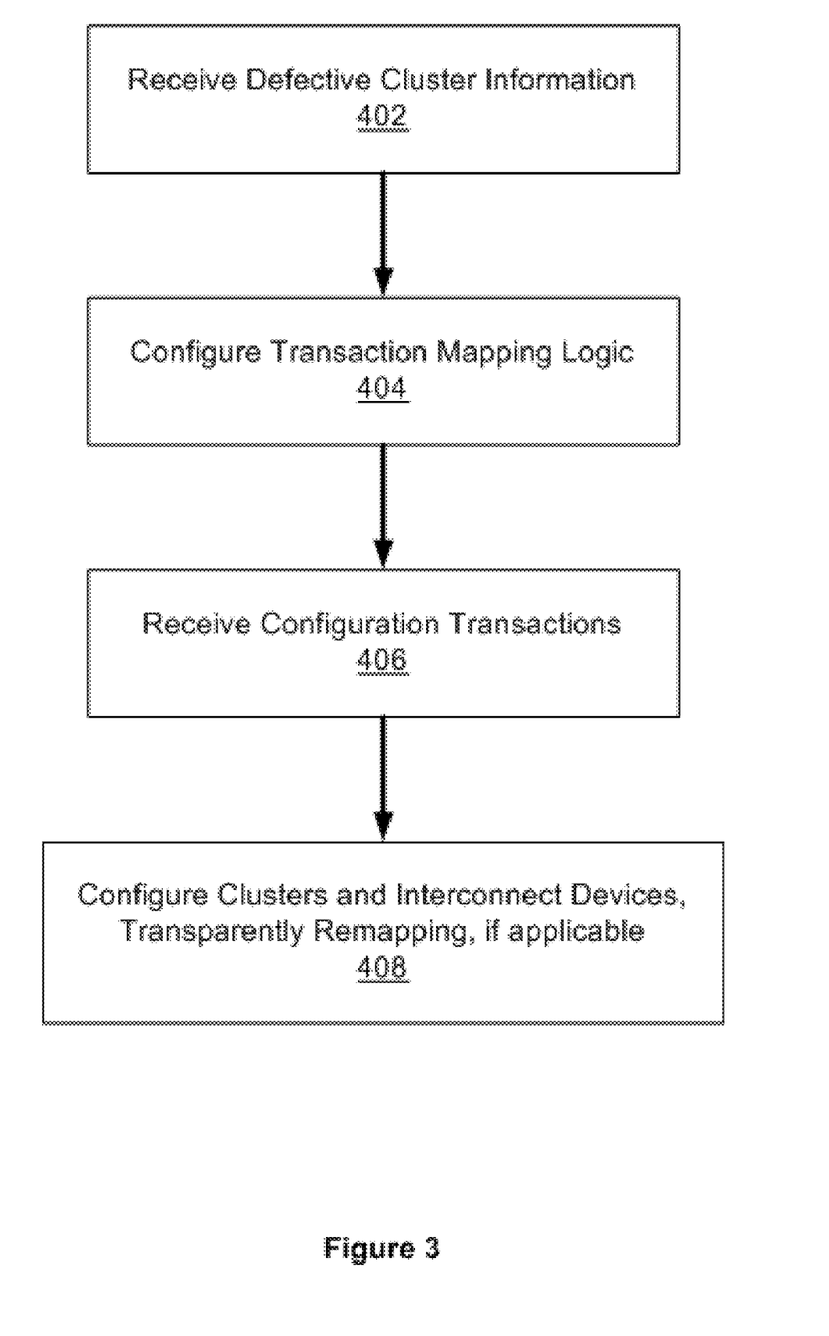
FIG. 3 illustrates a flowchart view of a method of operation, according to various embodiments.

Referring now to FIG. 3, wherein a flow chart view of an operational method of the invention, in accordance with various embodiments, is illustrated. As shown, method 400 starts with receipt 402 of cluster defective information, if any, by programming interface 220. As described earlier, the defective cluster information, if any, may be provided to programming interface 220 by an external source, or determined by programming interface 220 itself, depending on the embodiments.

Next, assuming the number of defective cluster or clusters is smaller than or equal to the number of redundant cluster or clusters available, programming interface 220 configures 404 its transaction mapping logic 224 accordingly, based at least in part on the defective cluster information received, if any. As described earlier, for various embodiments, if the number of defective clusters exceeds the number of redundant cluster or clusters available, programming interface 220 disables the macro-cluster and reports its disabled state.

Thereafter, programming interface 220 may be provided 406 with configuration information to configure clusters 240 and 250 and interconnect devices 230. In response, programming interface 220 programs 408 selected ones of clusters 240 and 250 and interconnect devices 230, accordingly, remapping the configuration transactions transparently, if applicable. Thus, as described earlier, under the present invention, configuration information may be advantageously provided in a transparent manner, without having to take into account whether any of the primary clusters are defective, and without the configuration of the clusters and the interconnect devices to realize certain target functions having to take these defective clusters into consideration.

As described earlier, for heterogeneous embodiments involving at least one "super" cluster, programming interface 220 may further configure the on or off state of the various resources in a "super" cluster, to configure the "super" cluster to functionally match the defective cluster being replaced.

Note that while the present invention is designed to enable defective elements of a reconfigurable circuit to be addressed transparently, the transparency can be achieved as long as the number of defective cluster or clusters is smaller than or equal to the number of redundant cluster or clusters available.

Figure 4:
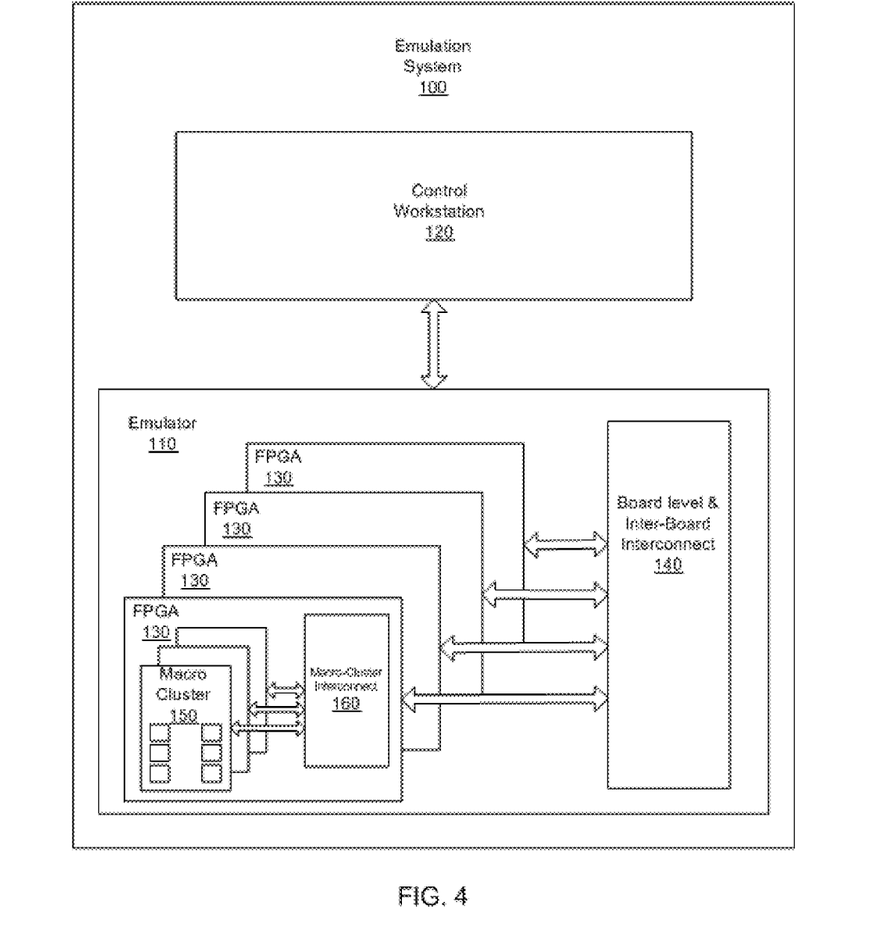
FIG. 4 illustrates a block diagram of an exemplary emulation system that includes reconfigurable circuits with redundant clusters, in accordance with various embodiments.

Referring now to FIG. 4, a block diagram of an exemplary emulation system 100 including reconfigurable circuits with redundant reconfigurable clusters, is illustrated. Exemplary emulation system 100 illustrates an example application of reconfigurable circuits with various embodiments of macro-clusters 200 and/or macro-cluster 500 as described elsewhere within this application.

As illustrated, emulation system 100 includes an emulator 110 and a control workstation 120. The emulator 110 includes a number of reconfigurable circuit devices 130 interconnected by board and/or board level interconnects 140. At least one of the reconfigurable circuit devices 130 has a number of interconnected macro-clusters 150. Further, at least one of the macro-clusters 150 may be implemented using any of embodiments of macro-cluster 200 and/or macro-cluster 500 as described elsewhere within this disclosure, or any other embodiments of a macro-cluster in accordance with embodiments of the present disclosure.

In various embodiments, the reconfigurable circuit devices 130 are organized into groups, and the groups are correspondingly disposed on a number of circuit boards (not shown). For these embodiments, board and/or board level interconnects 140 include board level interconnects reconfigurably and selectively interconnecting selected ones of the reconfigurable circuit devices 130 on the corresponding circuit boards. The inter-board interconnects in turn reconfigurably and selectively interconnect the board-level interconnects of the circuit boards to one another.

Except for reconfigurable circuit device 130 incorporated with one or more embodiments of macro-cluster 200, macro-cluster 500, or other macro-cluster in accordance with embodiments, other elements of emulation system 100 are intended to represent a broad category of these elements found in conventional emulation systems, and thus will not be otherwise further described.

Accordingly, emulation system 100 may be employed to more advantageously emulate one or more ASIC designs, to verify their correct operations, prior to rendering the ASIC designs into silicon, potentially further reducing the cost of the ASIC development.

In alternate embodiments, reconfigurable circuits having redundant clusters as described within this disclosure may be used in a variety of other systems, including but not limited to Compact Disc and/or Digital Versatile Disk players, set-top boxes, televisions, projection devices, and so forth.

Figure 5:
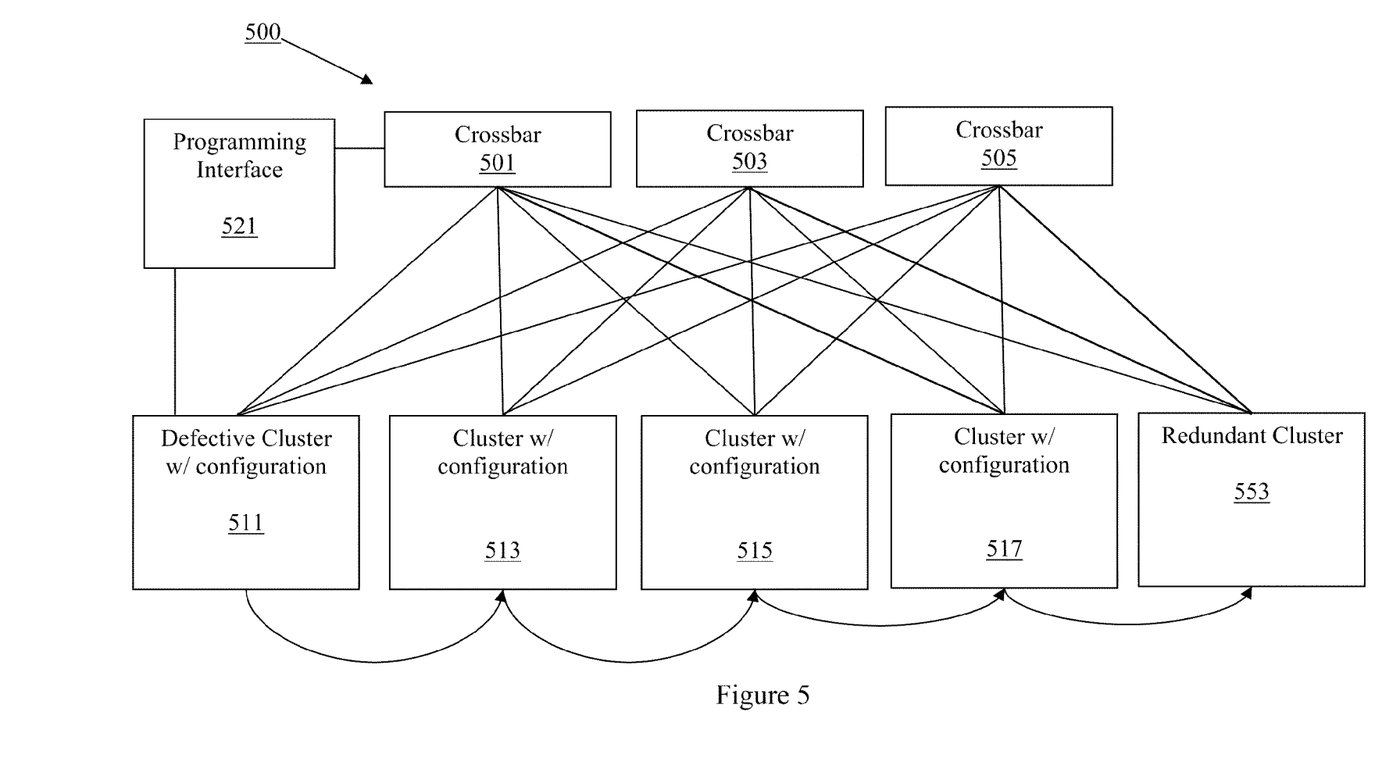
FIG. 5 illustrates a block diagram demonstrating a remapping of configuration data from a defective cluster to an adjacent cluster of reconfigurable logic in accordance with various embodiments.

FIG. 5 illustrates a block diagram demonstrating a remapping of configuration data from a defective cluster to an adjacent cluster, such as a physically adjacent cluster, of reconfigurable logic in accordance with various embodiments. Macro-Cluster 500 in FIG. 5 may have a plurality of crossbar devices 501-505 (e.g. reconfigurable interconnect devices) and a plurality of clusters 511-517, each having reconfigurable logic as described elsewhere within this application. Macro-Cluster 500 may also have redundant cluster 553 and a programming interface 521. Programming interface 521 may also include programming logic and a transaction mapping unit; the programming logic and the transaction mapping unit of programming interface 521 may be configured to function as described in accordance with FIG. 1, for example, or as modified by the description of programming interface 521 and related embodiments. Programming interface 521 may be coupled to all crossbar devices 501-505 and to all clusters 511-517 and 553, but such full interconnectivity is not shown in FIG. 5 for the sake of clarity. Each cluster 511-517 and 553 may be coupled to all of crossbars 501-503 as shown in FIG. 5. Even though only three crossbars and five clusters are shown in FIG. 5, it will be understood that more or fewer crossbars and clusters may be included within Macro-Cluster 500 according to various embodiments; a subset of crossbars and clusters are shown for ease of illustration.

In embodiments, programming interface 521 may be configured to receive configuration data to configure a first combination of clusters 511-517 and crossbars 501-505 to implement a circuit. This first combination may also include other clusters and/or crossbars not shown in FIG. 5. Programming interface 521 may be configured to remap a portion of the received configuration data that corresponds to defective cluster 511 to a non-defective cluster, such as redundant cluster 553 or clusters 513-517. In embodiments, programming interface 521 may be configured to remap the portion of the configuration data corresponding to defective cluster 511 to an adjacent cluster, such as cluster 513. Such an adjacent cluster may be physically adjacent, in embodiments.

The clusters may be thought of as a contiguous subset of clusters bounded by and including defective cluster 511 on one end, and bounded by but not including redundant cluster 553 on the other end. In the example shown in FIG. 5, a contiguous subset of clusters may include clusters 511-517. If—in an example not shown in FIG. 5—the defective cluster was adjacent to the redundant cluster (cluster 517 for example), the subset may include only the defective cluster.

Programming interface 521 may be configured to remap portions of the configuration data that corresponds to each cluster in the subset of clusters to adjacent clusters to implement the circuit, using a different combination of clusters and crossbars. This may include remapping connections between crossbars 501-505 and clusters 511-517 and 553. This remapping may include updating a lookup table within a transaction mapping unit as described elsewhere within this description. In the example shown in FIG. 5, the portion or portions of configuration data corresponding to defective cluster 511 may be remapped to cluster 513. The portion or portions of configuration data corresponding to cluster 513 may be mapped to cluster 515, and so on. The portion or portions of configuration data corresponding to cluster 517 may be mapped to redundant cluster 553, which is adjacent to cluster 517. Thus, in embodiments, the portion or portions of configuration data corresponding to defective cluster 511 may not be mapped to redundant cluster 553, but redundant cluster 553 may nevertheless be programmed as part of the circuit in the event of a detection of defective cluster 511.

By remapping the configuration data in this way, the resulting remapped combination of clusters and crossbars may result in better performance than if the portion or portions of configuration data corresponding to defective cluster 511 were mapped directly to redundant cluster 553. For example, the configuration data may have been designed to minimize the length of "hops" between reconfigurable logic devices within the clusters. By shifting the configurations over as shown by the arrows in FIG. 5, as opposed to directly remapping the configuration from defective cluster 511 to redundant cluster 553, the desired hop length minimization may be at least partially preserved.

In embodiments, programming interface 521 may be configured to detect a defect in one or more clusters or receive information about a defective cluster as described elsewhere within this description. Programming interface 521 may be configured to remap the configuration data as described elsewhere within this application upon detecting a defect or upon receiving such defect information. Clusters 511-517 may include test circuitry for facilitating the detection of defects as described elsewhere within this description. In embodiments, programming interface 521 may be configured to initially map the configuration data to clusters 511-517 as designated in the configuration data in order to configure the circuit using the combination of clusters and crossbars identified by the configuration data. Then, upon detecting the defective cluster—or receiving information about a defective cluster—programming interface 521 may be configured to initiate the remap operations. Programming interface 521 may also be configured to immediately remap received configuration data, without first mapping it to the designated clusters and crossbars, if programming interface 521 has already become aware of a defective cluster. Programming interface 521 may be configured to define a contiguous subset of the plurality of clusters bounded by and including a defective cluster 511, and bounded by but not including the redundant cluster 553. Programming interface may be configured to remap one or more corresponding portions of a received configuration data to each cluster of the contiguous subset of the plurality of clusters from each cluster of the contiguous subset to clusters adjacent to each cluster of the contiguous subset. The "contiguous subset" that may be defined is not necessarily a predefined subset of clusters. Rather, it may be defined in relation to the location of defective cluster 511 and redundant cluster 553. Programming interface 521 may be configured to define the contiguous subset such that it only includes a single cluster, which may include only defective cluster 511 if defective cluster 511 is determined to be adjacent to redundant cluster 553. In embodiments, programming interface 521 may not be configured to determine a contiguous subset as described above; rather, in such embodiments, programming interface 521 may be configured to remap corresponding portions of a received configuration data to adjacent clusters, beginning with defective cluster 511 until reaching redundant cluster 553.

Figure 6:
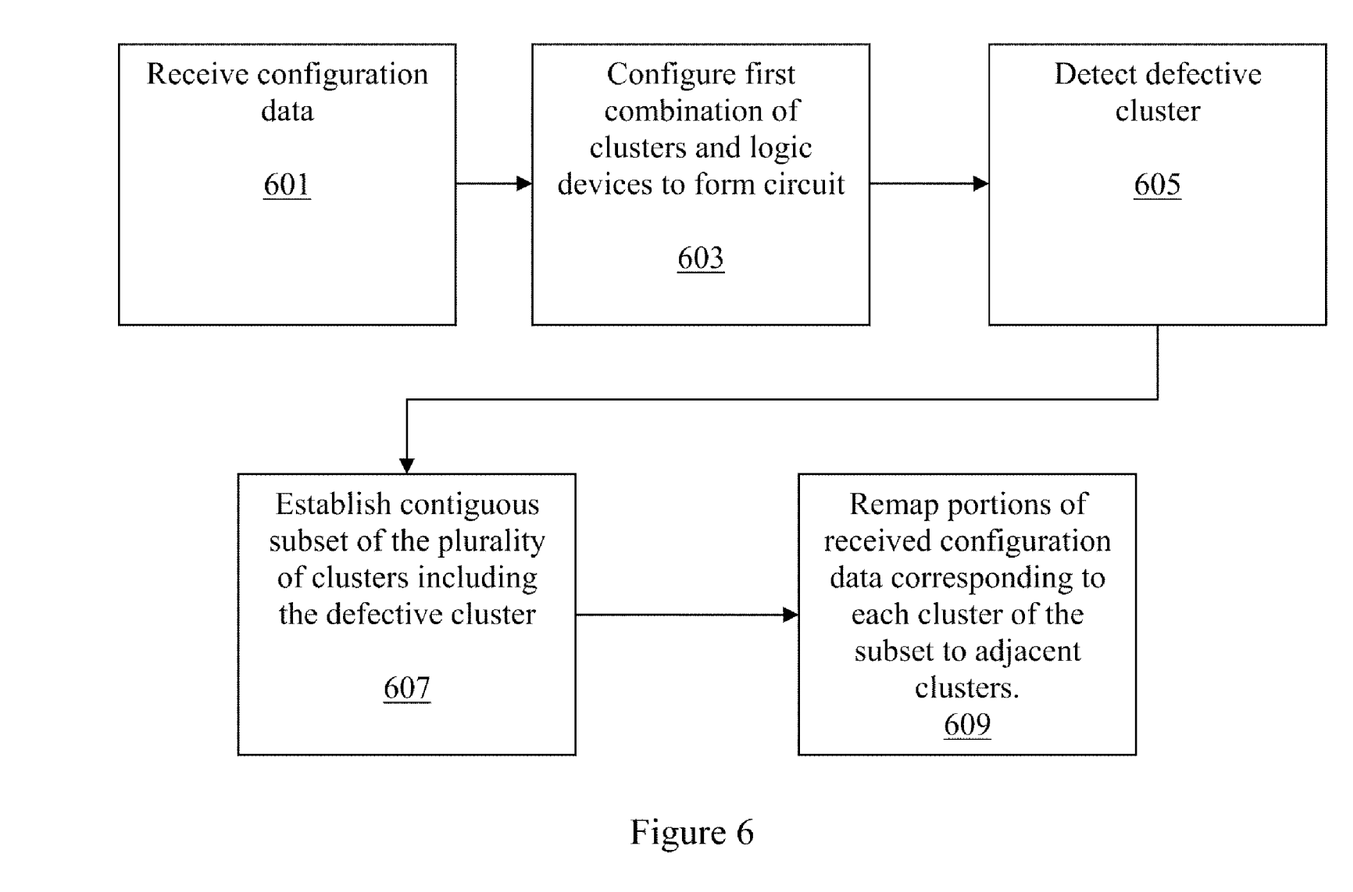
FIG. 6 illustrates a flow diagram of remapping configuration data from a defective cluster to an adjacent cluster of reconfigurable logic in accordance with various embodiments.

FIG. 6 illustrates a flow diagram of remapping configuration data from a defective cluster to an adjacent cluster of Macro-Cluster 500 in accordance with various embodiments. A programming interface device that is a component of a configurable device, such as programming interfaces described elsewhere within this specification, may be configured to receive configuration data to configure a first combination of reconfigurable interconnect (crossbar) and logic devices (such as clusters of logic devices as described elsewhere within this application) to implement a circuit, block 601. The programming interface device may be configured to configure the first combination of clusters and crossbar devices to form the circuit, block 603. In embodiments, the programming interface device may be configured to detect a defect in a cluster of the first combination of crossbars and clusters, block 605. The programming interface may be configured to establish a contiguous subset of the plurality of clusters, block 607. The contiguous subset may be bounded by and include the defective cluster on one end, and bounded by but not inclusive of, a redundant cluster on the other. In embodiments, the redundant cluster may be a designated redundant cluster. In alternative embodiments, the redundant cluster may be a cluster that has not been programmed to be part of any circuit, and is thus currently unused, but that is not necessarily reserved as a redundant cluster. The programming interface may then be configured to remap portions of the configuration data from each cluster in the subset to adjacent clusters, including remapping at least some portion of the configuration data to the redundant cluster block 609. This may result in a second combination of clusters and crossbars to implement the circuit.

In alternate embodiments, the programming interface may already be aware of a defective cluster by the time it receives the configuration data, and/or before it configures the first combination of clusters, and proceed directly from block 601 to block 607 without first configuring the first combination to implement the circuit.

Although specific embodiments have been illustrated and described herein, it will be appreciated by those of ordinary skill in the art and others, that a wide variety of alternate and/or equivalent implementations may be substituted for the specific embodiments shown in the described drawings without departing from the scope of the present invention. This application is intended to cover any adaptations or variations of the embodiment discussed herein. Therefore, it is manifested and intended that the invention be limited only by the claims and the equivalence thereof.

What is claimed is:

1. A reconfigurable circuit comprising:
a plurality of reconfigurable interconnect devices;
a plurality of clusters of reconfigurable logic devices, each cluster being coupled to the plurality of reconfigurable interconnect devices; and
a programming interface coupled to the plurality of reconfigurable interconnect devices and to the plurality of clusters of reconfigurable logic, the programming interface configured to receive configuration data to configure a first combination of the reconfigurable interconnect and logic devices to implement a circuit, and to remap a portion of the received configuration data, corresponding to a defective cluster, from the defective cluster to another non-defective cluster of the plurality of clusters to configure a second combination of the reconfigurable interconnect and logic devices to implement the circuit.

2. The reconfigurable circuit of claim 1, wherein the plurality of reconfigurable interconnect devices comprises a programming port, a plurality of input ports and a plurality of output ports, and reconfigurable connectivity coupled to the programming port, to the input ports, and to output ports, the reconfigurable connectivity configurable to selectively couple the input ports to the output ports in accordance with programming received via the programming port.

3. The reconfigurable circuit of claim 1, wherein the non-defective cluster is adjacent to the defective cluster.

4. The reconfigurable circuit of claim 1, wherein the non-defective cluster is a redundant cluster of reconfigurable logic.

5. The reconfigurable circuit of claim 1, wherein the programming interface is configured to remap one or more corresponding portions of the received configuration data corresponding to each cluster of a contiguous subset of the plurality of clusters from each cluster of the contiguous subset to clusters adjacent to each cluster of the contiguous subset, and wherein the contiguous subset is bounded by and includes the defective cluster, and is bounded by but does not include the non-defective cluster.

6. The reconfigurable circuit of claim 5, wherein the contiguous subset includes only the defective cluster.

7. The reconfigurable circuit of claim 5, wherein the programming interface is configured to determine the contiguous subset.

8. The reconfigurable circuit of claim 5, wherein the non-defective cluster is a redundant cluster.

9. The reconfigurable circuit as recited in claim 1, wherein each cluster includes:
a programming port;
$\alpha*k$ input ports, $\alpha$ of said input ports being coupled to each of k reconfigurable interconnect devices where k and $\alpha$ are integers;
$\beta*k$ output ports, $\beta$ of said output ports being coupled to each of k reconfigurable interconnect devices where k and $\beta$ are integers; and
a reconfigurable module coupled to the programming port and the input and output ports, and configurable to implement at least one of a plurality of functions in accordance with programming received via the programming port.

10. The reconfigurable circuit of claim 1, wherein the programming interface, the reconfigurable interconnect devices, and the reconfigurable logic form a macro-cluster.

11. The reconfigurable circuit of claim 10, wherein the reconfigurable circuit comprises at least one other macro-cluster, the macro-clusters being coupled to one another.

12. The reconfigurable circuit of claim 1, wherein the programming interface is further configured to detect a failure condition in the defective cluster.

13. A method comprising:
receiving, by a programming interface of a configurable device, configuration data to configure a first combination of reconfigurable interconnect and logic devices of the configurable device to implement a circuit; and
remapping, by the programming interface device, received configuration data from a defective cluster to another non-defective cluster of the plurality of clusters to configure a second combination of the reconfigurable interconnect and logic devices to implement the circuit.

14. The method of claim 13, comprising programming the non-defective cluster to operate in place of the defective cluster.

15. The method of claim 14, wherein the programming of the non-defective cluster comprises transparently configuring the non-defective cluster to function as the defective cluster was to function according to the configuration data, and wherein the method further comprises re-routing data destined for the defective cluster to the non-defective cluster.

16. The method of claim 13, wherein the remapping comprises programming at least one of a plurality of reconfigurable interconnect devices to receive signals targeted for the identified defective cluster on at least one of the interconnect device's plurality of input ports and to output the signals to the non-defective cluster on at least one of the interconnect device's plurality of output ports.

17. The method of claim 13 wherein the non-defective cluster is a redundant cluster.

18. The method of claim 13, wherein the method further comprises remapping, by the programming interface device, one or more corresponding portions of the received configuration data corresponding to each cluster of a contiguous subset of the plurality of clusters from each cluster of the contiguous subset to adjacent clusters, wherein the contiguous subset of the plurality of clusters is bounded by and includes the defective cluster, and is bounded by but does not include the non-defective cluster.

19. The method of claim 18, wherein the non-defective cluster is a redundant cluster.

20. The method of claim 13, further comprising receiving, by the programming interface device, data identifying the defective cluster.

21. A system comprising:
a plurality of boards, each board having a plurality of reconfigurable devices and board-level reconfigurable interconnects to reconfigurably and selectively interconnect the reconfigurable devices of the board to one another, wherein at least one of the reconfigurable devices includes a plurality of reconfigurable interconnect devices, a plurality of clusters of reconfigurable logic, and a programming interface configured to receive configuration data to configure a first combination of the reconfigurable interconnect and logic devices to implement a circuit, and to remap at least a portion of the incoming configuration data corresponding to a defective cluster from the defective cluster to a non-defective cluster of the plurality of clusters to configure a second combination of the reconfigurable interconnect and logic devices to implement the circuit; and
inter-board reconfigurable interconnects to reconfigurably and selectively interconnect the board level interconnects of the boards to one another.

22. The system of claim 21, wherein each reconfigurable interconnect device includes:

a programming port;

a plurality of input ports and a plurality of output ports; and reconfigurable connectivity coupled to the programming port, the input ports, and the output ports, and wherein the reconfigurable connectivity is configurable to selectively couple the input ports to the output ports in accordance with programming received via the programming port.

23. The system of claim 21, wherein each of the plurality of clusters are logically visible to external application data, and wherein the non-defective cluster is configurably identical to at least one cluster of the plurality of clusters of the reconfigurable circuit but not visible to the external application data.

24. The system of claim 21, wherein the programming interface is configured to remap one or more corresponding portions of the received configuration data corresponding to each cluster of a contiguous subset of the plurality of clusters from each cluster of the contiguous subset to clusters adjacent to each cluster of the contiguous subset, wherein the contiguous subset of the plurality of clusters is bounded by and includes the defective cluster on a first end, and is bounded by but does not include the non-defective cluster on a second end.

25. The system of 24, wherein the non-defective cluster is a redundant cluster.

26. The system of claim 21, wherein the non-defective cluster is a redundant cluster.

* * * * *